(12) United States Patent
Natsui et al.

(10) Patent No.: US 9,487,445 B2
(45) Date of Patent: Nov. 8, 2016

(54) CERAMIC COMPOSITION

(71) Applicant: TDK CORPORATION, Tokyo (JP)

(72) Inventors: Hidesada Natsui, Tokyo (JP); Taku Masai, Tokyo (JP); Sanshiro Aman, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/762,149

(22) PCT Filed: Mar. 24, 2014

(86) PCT No.: PCT/JP2014/057958
§ 371 (c)(1),
(2) Date: Jul. 20, 2015

(87) PCT Pub. No.: WO2014/157023
PCT Pub. Date: Oct. 2, 2014

(65) Prior Publication Data
US 2015/0353430 A1    Dec. 10, 2015

(30) Foreign Application Priority Data

Mar. 28, 2013 (JP) ................ 2013-067858

(51) Int. Cl.
*C04B 35/47* (2006.01)
*C04B 35/475* (2006.01)
(Continued)

(52) U.S. Cl.
CPC ............. *C04B 35/475* (2013.01); *C01G 49/00* (2013.01); *C01G 49/0036* (2013.01);
(Continued)

(58) Field of Classification Search
CPC .. C04B 35/47; C04B 35/26; C04B 2235/768
See application file for complete search history.

(56) References Cited

U.S. PATENT DOCUMENTS

| 7,470,390 B2* | 12/2008 | Nakamura | C04B 35/495 264/653 |
| 2005/0082946 A1* | 4/2005 | Takeuchi | B81B 3/0018 310/328 |
| 2006/0006360 A1* | 1/2006 | Takao | C04B 35/495 252/62.9 R |

FOREIGN PATENT DOCUMENTS

| JP | H07-187771 A | 7/1995 |
| JP | 2003-176180 A | 6/2003 |
| JP | 2008-263158 A | 10/2008 |

OTHER PUBLICATIONS

Kim et al. Multiferroic Property and Crystal Structural Transition of BiFeO3—SrTiO3 Ceramics. Journal of the Korean Ceramic Society vol. 48, No. 4, pp. 307-311, 2011.*
Glazer A. M., "The Classification of Tilted Octahedra in Perovskites", Acta Crystallography, UK, 1972, B28, p. 3384-3392.
Oka Kengo et al, "Polarization Rotation in the Monoclinic Perovskite BiCo1_xFexO3", Angewandte chemie international edition, Germany, 2012, vol. 51, Issue 32, pp. 7977-7980.
(Continued)

Primary Examiner — Noah Wiese
(74) Attorney, Agent, or Firm — Oliff PLC

(57) ABSTRACT

A novel ceramic composition having a high relative dielectric constant. A ceramic composition includes a unit cell having at least two crystal structures selected from the group made of a monoclinic crystal, a tetragonal crystal, an orthorhombic crystal, and a rhombohedral crystal, characterized in that when the crystal structures are represented by the symmetry notation according to the Glazer method, namely $x^{n1}y^{n2}z^{n3}$, n1, n2, and n3 are at least one selected from the group made of + and −, or at least two selected from the group made of 0, +, and −. By using this ceramic composition, a novel ceramic composition having a high relative dielectric constant can be obtained.

19 Claims, 9 Drawing Sheets

(51) Int. Cl.
*H01B 3/12* (2006.01)
*H01L 41/43* (2013.01)
*H01L 41/187* (2006.01)
*C01G 49/00* (2006.01)
*C04B 35/26* (2006.01)
*C04B 35/462* (2006.01)
*C04B 35/00* (2006.01)

(52) U.S. Cl.
CPC .............. *C04B 35/00* (2013.01); *C04B 35/26* (2013.01); *C04B 35/462* (2013.01); *C04B 35/47* (2013.01); *H01B 3/12* (2013.01); *H01L 41/187* (2013.01); *H01L 41/1878* (2013.01); *H01L 41/43* (2013.01); *C01P 2002/34* (2013.01); *C04B 2235/3201* (2013.01); *C04B 2235/3213* (2013.01); *C04B 2235/3232* (2013.01); *C04B 2235/3298* (2013.01); *C04B 2235/5445* (2013.01); *C04B 2235/5454* (2013.01); *C04B 2235/6562* (2013.01); *C04B 2235/765* (2013.01); *C04B 2235/768* (2013.01)

(56) References Cited

OTHER PUBLICATIONS

Kim, A. Young et al., "Multiferroic Property and Crystal Structural Transition of BiFeO3—SrTiO3 Ceramics", Journal of the Korean Ceramic Society, 2011, vol. 48, No. 4, pp. 307-311.
Jul. 1, 2014 Search Report issued in International Patent Application No. PCT/JP2014/057958.
Jul. 1, 2014 Written Opinion issued in International Patent Application No. PCT/JP2014/057958.
Itoh, Naoyuki et al., "Fabrication and properties of BiFeO3—SrTiO3 Ceramics by Solid State Reaction", Transactions of the Materials Research Society of Japan, 2007, vol. 32, No. 1 pp. 47-50.
Rout, Dibyaranjan et al., "Dielectric and Raman scattering studies of phase transitions in the (100-x) Na0.5Bi0.5TiO3—xSrTiO3 system", Journal of Applied Physics, 2010, vol. 108, pp. 084102-1-084102-7.
Ranjan, Rajeev et al., "Degenerate rhombohedral and orthorhombic states in Ca-substituted Na0.5Bi0.5TiO3", Applied Physics Letters, 2009, vol. 95, pp. 042904-1-042904-3.

* cited by examiner

CERAMIC COMPOSITION

TECHNICAL FIELD

The present invention relates to a ceramic composition having a perovskite structure.

BACKGROUND ART

Dielectric ceramic compositions that are conventionally used are broadly separated into two types: ferroelectric and paraelectric. As a ferroelectric ceramic composition, for example, Patent Literature 1 discloses a dielectric ceramic composition represented by general formula $ABO_3$ (where A is Ba or Ba partially substituted with at least one of Sr, Ca, and Mg, and B is Ti or Ti partially substituted with at least one of Mn, Zr, Sn, Nb, Ta, and V) and having a relative dielectric constant of 2,000 to 3,000. On the other hand, regarding Pb-based dielectric ceramic compositions, in Pb(Mn, Nb)O3-PbTiO3 compounds and the like, it is generally known that by using the morphotropic phase boundary (hereinafter referred to as "MPB"), it is possible to obtain a dielectric constant of 2,000 or more.

Furthermore, as a paraelectric ceramic composition, for example, Patent Literature 2 discloses a dielectric ceramic composition which is a composite oxide including a main component including at least one of Ba, Nd, Ti, and Zr or Sn added with Mn, having a relative dielectric constant of less than 100, in which the main component is represented by composition formula $xBaO \cdot yNd_2O_3 \cdot z[(1-c)TiO_2+cMeO_2]$ (where $x+y+z=1.0$, $0<c<1$, and Me is at least one element of Zr and Sn), in terms of molar ratio of metal elements.

CITATION LIST

Patent Literature

PTL 1: Japanese Unexamined Patent Application Publication No. 2003-176180
PTL 2: Japanese Unexamined Patent Application Publication No. 7-187771
PTL 3: Japanese Unexamined Patent Application Publication No. 2008-263158

Non Patent Literature

NPL 1: A. M. Glazer, The classification of tilted octahedra in perovskites, Acta crystalography, (UK), 1972, B28, pp. 3384-3392
NPL 2: K. Oka and five others, Polarization rotation in the monoclinic perovskite $BiCo_{1-x}Fe_xO_3$, Angewandte chemie international edition, (Germany), 2012, Vol. 51, Issue 32, pp. 7977-7980
NPL 3: A. Y. Kim and three others, Multiferroic property and crystal structure transition of $BiFeO_3$—$SrTiO_3$ ceramics, Journal of the Korean ceramic society, (Republic of Korea), 2011, Vol. 48, No. 4, pp. 307-311

SUMMARY OF INVENTION

Technical Problem

However, ceramic compositions in which a large dielectric constant can be obtained using the MPB composition as described above are only found in lead-containing material systems as described above that are desired to be used in small amounts or prohibited from use from the viewpoint of environmental protection in recent years. Furthermore, regarding non-lead-based materials, there are examples in which by simply combining a rhombohedral crystal with a tetragonal crystal, it is not always possible to obtain a large dielectric constant or piezoelectric constant.

In order to clarify the reason for this, considerations have been made and experiments have been performed from the standpoint of the movement of polarization vectors. In the $Bi(FeCo)O_3$ material disclosed in Non-Patent Literature 2, in the transformation of the crystal structure of the unit cell from the tetragonal crystal to the monoclinic crystal, the magnitude of the polarization vector does not change. However, in further transformation of the crystal structure from the monoclinic crystal to the rhombohedral crystal, in the process of rotation of the polarization vector, the magnitude of the polarization vector changes, and the moment produced by rotation of the polarization vector does not continue from the tetragonal crystal to the rhombohedral crystal, but is interrupted. Therefore, in the dielectric ceramic composition, it is believed that it is not possible to achieve a sufficiently high relative dielectric constant property.

Furthermore, the $BiFeO_3$—$SrTiO_3$ disclosed in Non-Patent Literature 3 is composed of a rhombohedral crystal and a cubic crystal which does not have a polarization vector, and therefore has a structure in which no moment is produced by rotation of the polarization vector.

Furthermore, in the $BaTiO_3$-based material disclosed in Patent Literature 1, even if a normal electric field is applied, transformation does not occur from the tetragonal crystal structure to another crystal structure. Therefore, it is believed that no moment is produced by rotation of the polarization vector.

Since the paraelectric material disclosed in Patent Literature 2 does not have spontaneous polarization, it does not have a specific polarization vector. Therefore, it is believed that no moment is produced by rotation of the polarization vector.

Furthermore, in the $Bi(CoCr)O_3$ material disclosed in the example of Patent Literature 3, since there is a difference in the periodicity of the unit cell of the crystal structure between $BiCoO_3$ and $BiCrO_3$, it is also believed that no rotation of the polarization vector occurs.

Accordingly, the present invention has been achieved in view of the above-described situation of the related art. It is an object of the present invention to provide a dielectric ceramic composition as a ceramic composition having a high relative dielectric constant.

Solution to Problem

The present inventors have performed thorough analyses on crystal structures in which the polarization vector can be rotated. As a result, it has been found that regularity is required for a crystal structure in which the magnitude of the polarization vector does not change during the transformation of the crystal structure, which has led to the present invention.

In order to solve the problems described above and achieve the object, a first ceramic composition according to the present invention is a perovskite-type ceramic composition including a unit cell having at least two crystal structures selected from the group consisting of a monoclinic crystal, a tetragonal crystal, an orthorhombic crystal, and a rhombohedral crystal, characterized in that when the crystal structures are represented by the symmetry notation according to the Glazer method, namely $x^{n1}y^{n2}z^{n3}$, n1, n2, and n3 are at least one selected from the group consisting of + and −, or at least two selected from the group consisting of 0, +, and −. By using this ceramic composition, a large amount of polarization inversion can be achieved, and as a result, a large dielectric constant can be obtained.

A second ceramic composition according to the present invention is a ceramic composition including a unit cell having at least two crystal structures including one being a tetragonal crystal in which when the tetragonal crystal is represented by the symmetry notation according to the Glazer method, x=y and the tetragonal crystal is expressed as $x^0y^0z^-$, and another being selected from the group consisting of a tetragonal crystal, an orthorhombic crystal, and a rhombohedral crystal, characterized in that when the monoclinic crystal, the tetragonal crystal, the orthorhombic crystal, and the rhombohedral crystal are represented by the symmetry notation according to the Glazer method, namely $x^{n1}y^{n2}z^{n3}$, n1, n2, and n3 are at least one selected from the group consisting of + and −, or at least two selected from the group consisting of 0, +, and −. By forming this material into a solid solution in the range that satisfies the conditions described above, a large amount of polarization inversion can be achieved, and as a result, a large dielectric constant can be obtained.

A third ceramic composition according to the present invention is a ceramic composition including a unit cell having at least two crystal structures including one being a rhombohedral crystal, characterized in that when the rhombohedral crystal is represented by the symmetry notation according to the Glazer method, x=y=z and the rhombohedral crystal is expressed as $x^-y^-z^-$, and another being selected from the group consisting of a tetragonal crystal, an orthorhombic crystal, and a rhombohedral crystal, characterized in that when the monoclinic crystal, the tetragonal crystal, the orthorhombic crystal, and the rhombohedral crystal are represented by the symmetry notation according to the Glazer method, namely $x^{n1}y^{n2}z^{n3}$, n1, n2, and n3 are at least one selected from the group consisting of + and −, or at least two selected from the group consisting of 0, +, and −. By forming this material into a solid solution in the range that satisfies the conditions described above, a large amount of polarization inversion can be achieved, and as a result, a large dielectric constant can be obtained.

A fourth ceramic composition according to the present invention is a ceramic composition including a unit cell having at least two crystal structures selected from the group consisting of a monoclinic crystal, a tetragonal crystal, an orthorhombic crystal, and a rhombohedral crystal, characterized in that when the monoclinic crystal, the tetragonal crystal, the orthorhombic crystal, and the rhombohedral crystal are represented by the symmetry notation according to the Glazer method, namely $x^{n1}y^{n2}z^{n3}$, n1, n2, and n3 are at least one selected from the group consisting of + and −, or at least two selected from the group consisting of 0, +, and −. By forming this material into a solid solution in the range that satisfies the conditions described above, a large amount of polarization inversion can be achieved, and as a result, a large dielectric constant can be obtained.

A fifth ceramic composition according to the present invention is a ceramic composition including a unit cell having at least two crystal structures selected from the group consisting of a monoclinic crystal, a tetragonal crystal, an orthorhombic crystal, and a rhombohedral crystal, characterized in that when the monoclinic crystal, the tetragonal crystal, the orthorhombic crystal, and the rhombohedral crystal are represented by the symmetry notation according to the Glazer method, namely $x^{n1}y^{n2}z^{n3}$, n1, n2, and n3 are at least one selected from the group consisting of + and −, or at least two selected from the group consisting of 0, +, and − and that the ceramic composition is represented by general formula $ABR_3$ where A is at least one selected from the group consisting of Ba, Bi, Ca, Na, Sr, and K, B is at least one selected from the group consisting of Nb, Ta, Ti, Zr, Fe, Hf, Sn, Co, and Mn, and R is O or N. By forming this material into a solid solution in the range that satisfies the conditions described above, a large amount of polarization inversion can be achieved, and as a result, a large dielectric constant can be obtained.

Advantageous Effects of Invention

According to the present invention, it is possible to obtain a novel ceramic composition having a high relative dielectric constant.

DESCRIPTION OF EMBODIMENTS

Figure 1:
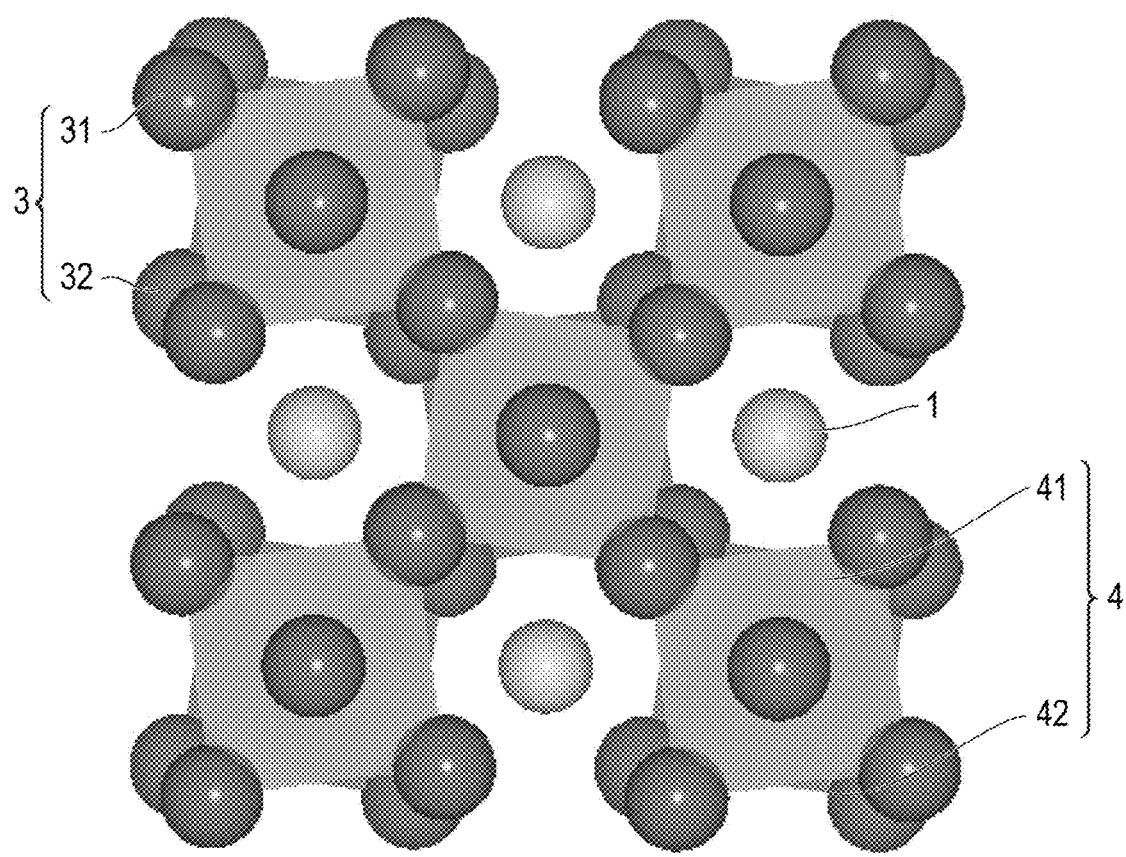
FIG. 1 is a schematic diagram of a crystal structure of $SrZrO_3$, viewed in the l-axis direction.

Preferred embodiments of the present invention will be described below, with reference to drawings as necessary. In the drawings, the same or equivalent elements are designated by the same reference signs and duplicate descriptions are omitted.

A ceramic composition according to an embodiment is characterized by having, as a main structure, a unit cell including at least two selected from the group consisting of a monoclinic crystal, a tetragonal crystal, an orthorhombic crystal, and a rhombohedral crystal, and in that when the monoclinic crystal, the tetragonal crystal, the orthorhombic crystal, and the rhombohedral crystal are represented by the symmetry notation according to the Glazer method, namely $x^{n1}y^{n2}z^{n3}$, n1, n2, and n3 are at least one selected from the group consisting of + and −, or at least two selected from the group consisting of 0, +, and −. The Glazer method is a classification method focused on the regularity of the tilt direction of octahedral structures composed of oxygen atoms present in a perovskite structure, and the perovskite structure can be classified into 23 kinds.

At the h-axis, the k-axis, and the l-axis of the crystal structure, octahedra composed of oxygen shift so as to rotate about their respective axes, and the shift amounts are indicated as tilt amounts of the whole octahedra using x, y, and z. The tilt amount is an arbitrary value related to the constituent material. Here, in order to indicate the magnitude of the tilt amount, symbols a, b, and c are used. That is, in the case where the tilt amount is the same when viewed in any of the h-axis, k-axis, and l-axis directions (around any axis), x, y, and z are all denoted by any one of a, b, and c. In the case where there are two types of tilt, x, y, and z are denoted by a and b, a and c, or b and c. In the case where the tilt amounts are different in all of the h-axis, k-axis, and the l-axis directions, x, y, and z are denoted by a, b, and c. Furthermore, 0, +, and − of n1, n2, and n3 each indicate the shift direction of the tilt (tilt direction). 0 indicates no tilt, + and − indicate the phase difference in the tilt direction, + represents in-phase, and − represents anti-phase.

Unit cells can be classified by 7 crystal systems and 14 types of Bravais lattices, which are used for classifying the crystal structure of materials, and by a space group method in which a finer classification is performed. When the space group method is used, crystal structures can be classified into 230 types. When a classification is performed from the viewpoint of the space group, the same tetragonal perovskite structure can be classified into various crystal structures. As the classification method, the Glazer method that can classify in detail the regularity of the perovskite structure is used. The Glazer method is a method for classifying perovskite-type crystal structures described in Non-Patent Literature 1. Here, x, y, and z indicate the tilt angles of octahedra viewed in the h-axis, k-axis, and l-axis directions of the crystal structure, and n1, n2, and n3 are selected from the group consisting of 0, +, and −. 0 indicates no tilt, + and − indicate the phase difference in the tilt direction, + represents in-phase, and − represents anti-phase.

Examples of specific classifications by the Glazer method will be shown using tetragonal crystal structures of $SrZrO_3$ and $BaTiO_3$. In $SrZrO_3$, x=y=z, the value thereof being denoted as a, n1=0, n2=0, and n3=−, and thus $SrZrO_3$ can be expressed as $a^0a^0a^-$. In $BaTiO^3$, x=y=z, the value thereof being denoted as a, and n1=n2=n3=0, and thus $BaTiO^3$ can be expressed as $a^0a^0a^0$. The reason for denoting all of x, y, and z as a is that, in the case of $SrZrO_3$, since octahedra have a rotational shift a around the l-axis only, the tilt amount of the whole octahedra is indicated only by one type: a. In the case of $BaTiO_3$, since there is no rotational shift around any of the axes, the tilt amount of the whole octahedra is indicated only by one type: a.

The crystal structure of $SrZrO_3$ is composed of Sr atoms 1, Zr atoms 2, oxygen atoms 3, and octahedral structures 4 which are regions each surrounded by six oxygen atoms 3. FIG. 1 is a schematic diagram of the crystal structure of $SrZrO_3$, viewed in the l-axis direction of a unit cell modified with oxygen atoms 3. In FIG. 1, the Zr atom 2 (FIG. 2) is located in the body center of the octahedral structure 4 surrounded with oxygen atoms 3, but is hidden by oxygen atoms 3 modifying the unit cell, and thus is not shown. Furthermore, those that are located at the same position as the Zr atom 2 on the l-axis overlap each other, and thus are not shown. Sr atoms 1 located at the same position on the l-axis overlap each other, and thus hidden Sr atoms 1 are not shown. Regarding oxygen atoms 3 modifying the periphery of Zr atoms 2 around the l-axis, there are oxygen atoms 31, 32, and 33 in the l-axis direction. In this case, the oxygen atoms 31 and 33 overlap each other (in the depth direction in FIG. 1) when viewed in the l-axis direction, and thus the oxygen atom 33 is not shown. Similarly, regarding the octahedral structures 4, there are three octahedral structures, i.e., octahedral structures 41, 42, and 43, (in the depth direction in FIG. 1) when viewed in the l-axis direction. In this case, the octahedral structures 41 and 43 overlap each other in the depth direction in FIG. 1, and thus the octahedral structure 43 is not shown. In other words, the octahedral structures 41 and 42 rotate and shift in the circumferential direction around the l-axis and have a tilt amount, and are in an anti-phase tilting position in the tilting direction.

Figure 2:
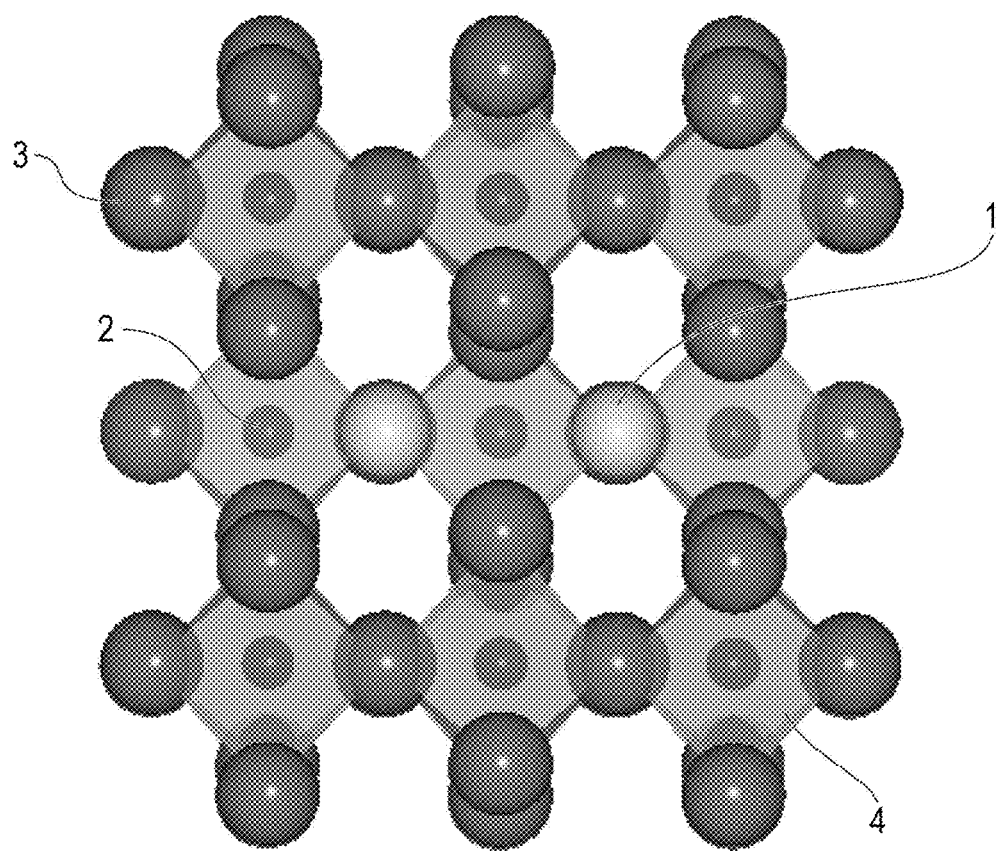
FIG. 2 is a schematic diagram of a crystal structure of $SrZrO_3$, viewed in the k-axis direction.

FIG. 2 is a schematic diagram of the crystal structure of $SrZrO_3$, viewed in the k-axis direction of a unit cell modified with oxygen atoms 3. A Zr atom 2 is located in the body center of the octahedral structure 4 composed of oxygen atoms 3. In FIG. 2, those that are located at the same position as the Zr atom on the k-axis overlap each other, and thus are not shown. Regarding octahedral structures 4, there are octahedral structures 41, 42, and 43 in the k-axis direction (in the depth direction in FIG. 2). In FIG. 2, since the octahedral structures 41, 42, and 43 overlap one another in the depth direction in FIG. 2, the octahedral structures 42 and 43 are not shown. Furthermore, Sr atoms 1 located at the same position on the k-axis (in the depth direction in FIG. 2) overlap each other, and thus hidden Sr atoms 1 are not shown. In other words, the octahedral structures 4 do not rotate in the circumferential direction around the k-axis, the tilt amount of the octahedra does not change, and tilting does not occur. Therefore, the phase difference in the tilting direction is zero.

Figure 3:
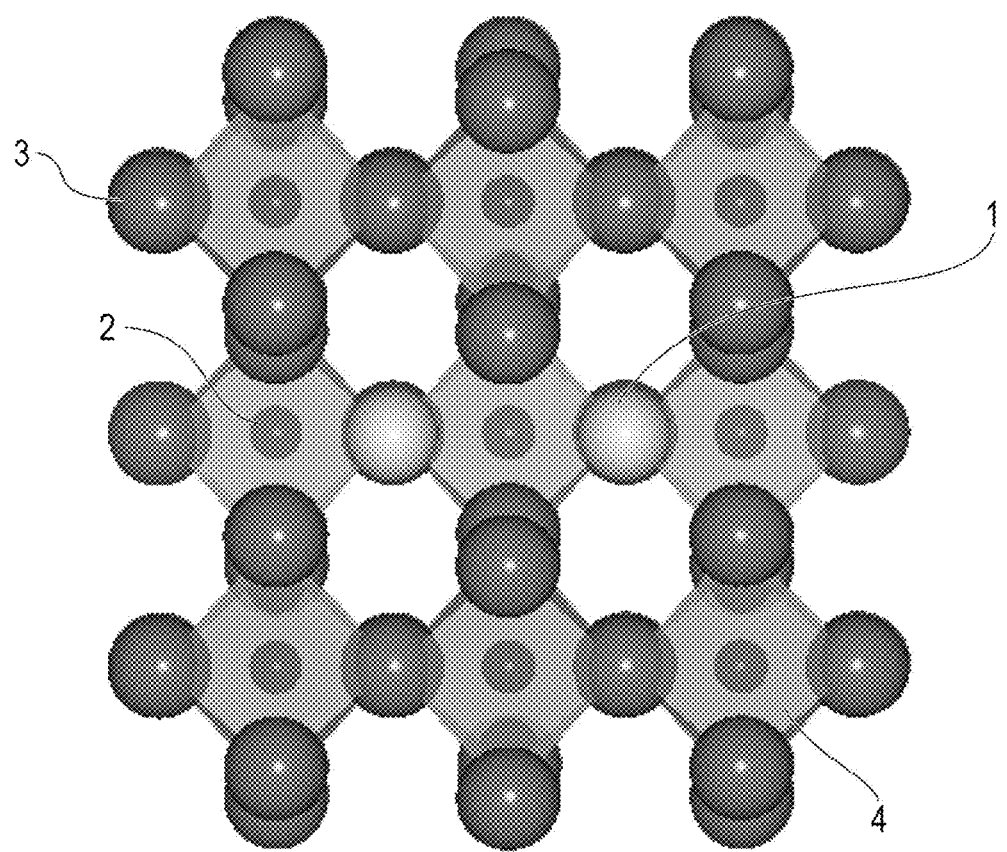
FIG. 3 is a schematic diagram of a crystal structure of $SrZrO_3$, viewed in the h-axis direction.

FIG. 3 is a schematic diagram of the crystal structure of $SrZrO_3$, viewed in the h-axis direction of a unit cell modified with oxygen atoms 3. A Zr atom 2 is located in the body center of the octahedral structure 4 composed of oxygen atoms 3. In FIG. 3, those that are located at the same position as the Zr atom 2 on the h-axis (in the depth direction in FIG. 3) overlap each other, and thus other Zr atoms on the h-axis are not shown. Regarding octahedral structures 4, there are octahedral structures 41, 42, and 43 in the h-axis direction (in the depth direction in FIG. 3). In FIG. 3, since the octahedral structures 41, 42, and 43 overlap one another, the octahedral structures 42 and 43 are not shown. Furthermore, Sr atoms 1 located at the same position on the h-axis overlap each other, and thus hidden Sr atoms 1 are not shown. In other words, the octahedral structures 4 do not rotate in the circumferential direction around the h-axis, the tilt amount of the octahedra does not change, and tilting does not occur. Therefore, the phase difference in the tilting direction is zero.

Figure 4:
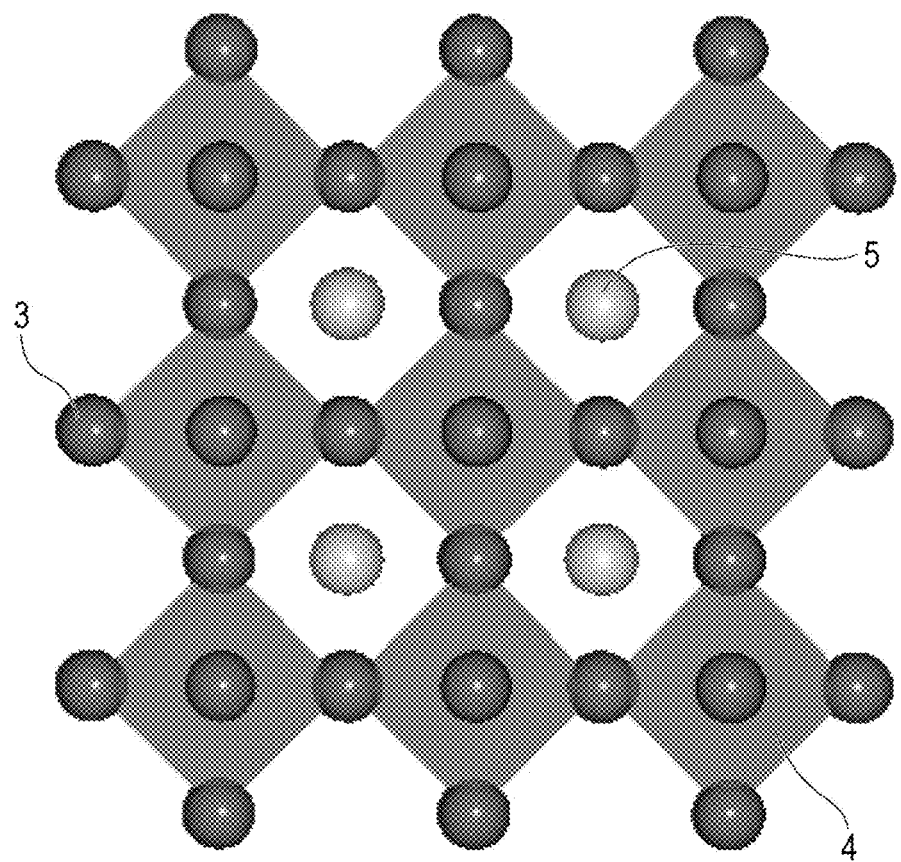
FIG. 4 is a schematic diagram of a crystal structure of $BaTiO_3$, viewed in the l-axis direction.

The crystal structure of $BaTiO_3$ is composed of Ba atoms 5, Ti atoms, oxygen atoms 3, and octahedral structures 4 which are regions each surrounded by six oxygen atoms 3. FIG. 4 is a schematic diagram of the crystal structure of $BaTiO_3$, viewed in the l-axis direction of a unit cell modified with oxygen atoms 3. In FIG. 4, the Ti atom is located in the octahedral structure 4 surrounded with oxygen atoms 3, but is hidden by oxygen atoms 3 modifying the unit cell, and thus is not shown. Furthermore, those that are located at the same position as the Ti atom on the l-axis (in the depth direction in FIG. 4) overlap each other, and thus are not shown. Ba atoms 5 located at the same position on the l-axis overlap each other, and thus hidden Ba atoms 5 are not shown. Regarding oxygen atoms 3 modifying the periphery of Ti atoms in the l-axis direction (in the depth direction in FIG. 4), there are oxygen atoms 31, 32, and 33 in the l-axis direction. In this case, since the oxygen atoms 31, 32, and 33 overlap one another in the depth direction, the oxygen atoms 32 and 33 are not shown. Similarly, regarding octahedral structures 4, there are three octahedral structures, i.e., octahedral structures 41, 42, and 43, in the l-axis direction. In this case, since the octahedral structures 41, 42, and 43 overlap one another in the depth direction, the octahedral structures 42 and 43 are not shown. In other words, the octahedral structures 4 do not rotate in the circumferential direction around the l-axis, the tilt amount of the octahedra does not change, and tilting does not occur. Therefore, the phase difference in the tilting direction is zero.

Figure 5:
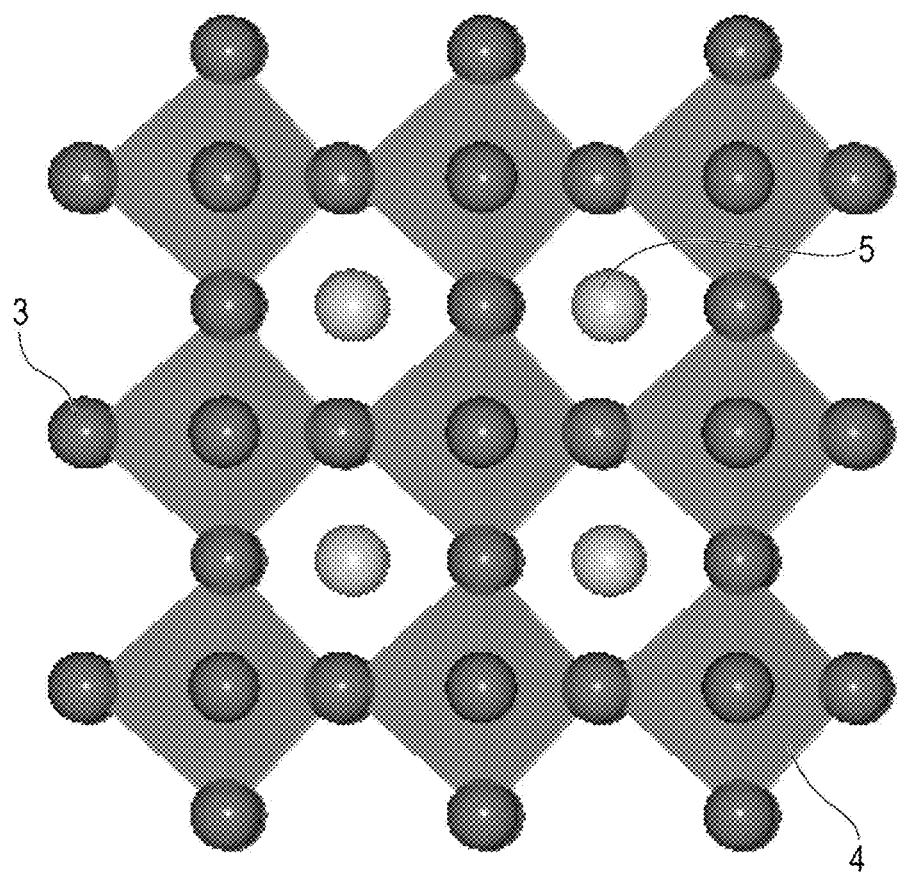
FIG. 5 is a schematic diagram of a crystal structure of $BaTiO_3$, viewed in the k-axis direction.

FIG. 5 is a schematic diagram of the crystal structure of $BaTiO_3$, viewed in the k-axis direction of a unit cell modified with oxygen atoms 3. The Ti atom is located in the octahedral structure 4 composed of oxygen atoms 3, but is hidden by oxygen atoms 3 modifying the unit cell in the depth direction in FIG. 5, and thus is not shown. Furthermore, in FIG. 5, regarding octahedral structures 4, there are octahedral structures 41, 42, and 43 in the k-axis direction (in the depth direction in FIG. 5). In FIG. 5, since the octahedral structures 41, 42, and 43 overlap one another in the depth direction, the octahedral structures 42 and 43 are not shown. Furthermore, Ba atoms 5 located at the same position on the k-axis (in the depth direction in FIG. 5) overlap each other, and thus hidden Ba atoms 5 are not shown. In other words, the octahedral structures 4 do not rotate in the circumferential direction around the k-axis, the tilt amount of the octahedra does not change, and tilting does not occur. Therefore, the phase difference in the tilting direction is zero.

Figure 6:
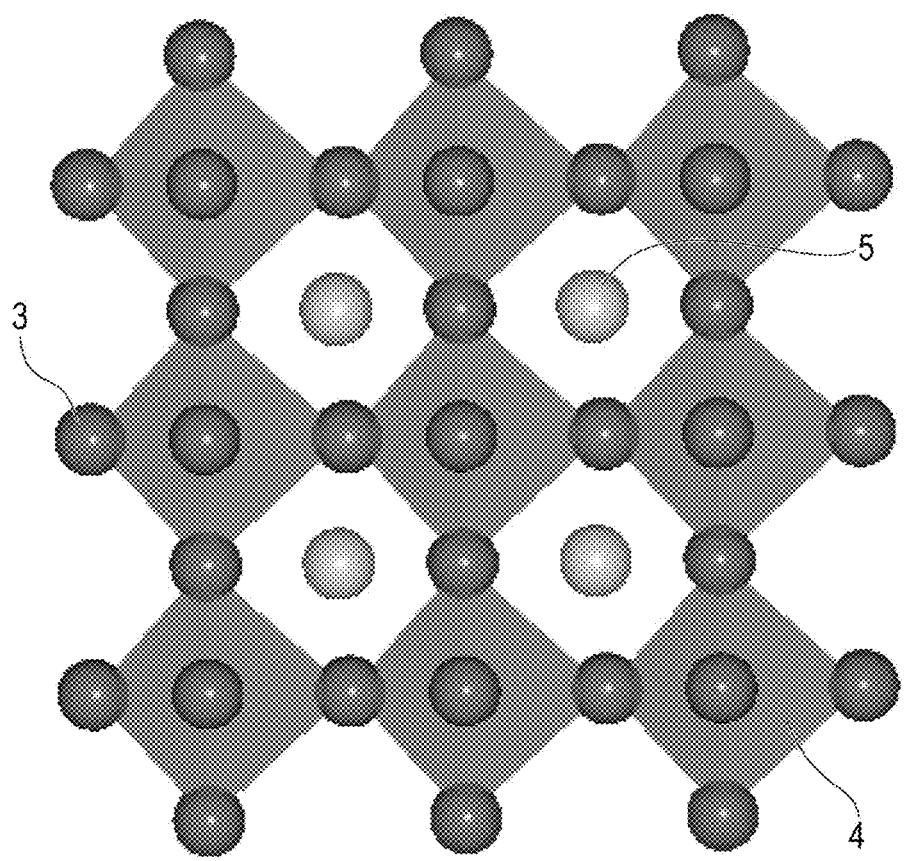
FIG. 6 is a schematic diagram of a crystal structure of $BaTiO_3$, viewed in the h-axis direction.

FIG. 6 is a schematic diagram of the crystal structure of $BaTiO_3$, viewed in the h-axis direction of a unit cell modified with oxygen atoms 3. The Ti atom is located in the octahedral structure 4 composed of oxygen atoms 3, but is hidden by oxygen atoms 3 modifying the unit cell in the depth direction in FIG. 6, and thus is not shown. Furthermore, in FIG. 6, regarding octahedral structures 4, there are octahedral structures 41, 42, and 43 in the h-axis direction (in the depth direction in FIG. 6). In FIG. 6, since the octahedral structures 41, 42, and 43 overlap one another in the depth direction, the overlapping structures are shown as the octahedral structure 4, and the octahedral structures 42 and 43 are not shown. Furthermore, Ba atoms 5 located at the same position on the h-axis (in the depth direction in FIG. 6) overlap each other, and thus hidden Ba atoms 5 are not shown. In other words, the octahedral structures 4 do not rotate in the circumferential direction around the h-axis, the tilt amount of the octahedra does not change, and tilting does not occur. Therefore, the phase difference in the tilting direction is zero.

The regularity of the crystal structure of $SrZrO_3$ is represented as $a^0a^0a^-$ under the classification by the Glazer method, in which − indicates that an anti-phase is shown only in the l-axis direction. As shown in FIGS. 1, 2, and 3, only when viewed in the l-axis direction, the octahedral structures 41 and the octahedral structures 42 are alternately tilted anti-phase, and the adjacent octahedral structures 4 in the depth direction in the drawing can be seen. When viewed in the h-axis and k-axis directions, the adjacent octahedral structures 4 in the depth direction in the drawing cannot be seen, and the octahedral structures 4 do not tilt.

On the other hand, the regularity of the crystal structure of $BaTiO_3$ is represented as $a^0a^0a^0$ under the classification by the Glazer method, in which the sign indicating the tilting direction of the octahedral structures 4 is 0 in any of the h-, k-, and l-axis directions of the crystal structure. As shown in FIGS. 4, 5, and 6, the octahedral structures 4 do not tilt, and the octahedral structures 4 in the depth direction in the drawing overlap each other when viewed in any of the h-axis, k-axis, and l-axis directions. That is, regarding the tetragonal crystal structures of $BaTiO_3$ and $SrZrO_3$, $SrZrO_3$ has a periodic structure including tilting of octahedral structures in the unit cell, and $BaTiO_3$ does not have a periodic structure due to tilting of octahedral structures in the unit cell. Therefore, the crystal structures are different.

Furthermore, in a substance other than $SrZrO_3$ and $BaTiO_3$, for example, in the case where an in-phase rotational shift around the h-axis and an anti-phase rotational shift around the k-axis exist, and a rotational shift around the l-axis does not exist, the substance can be expressed as $a^+b^-b^0$.

In the identification of the unit cells, the space group and the atomic coordinates can be identified by Rietveld analysis of x-ray diffraction and neutron diffraction data and electron diffraction using a transmission electron microscope (TEM) or the like. Furthermore, the perovskite-type crystal structure can be classified by the Glazer method on the basis of the space group and the atomic coordinates.

The periodicity of the crystal structure is a factor that affects the magnitude of the polarization vector, and the magnitude of the polarization vector affects the rotation of the polarization vector. That is, when $Bi(FeCo)O_3$, which is a combination of rhombohedral $BiFeO_3$ and tetragonal $BiCoO_3$, described in Non-Patent Literature 2 is expressed by the classification by the Glazer method, $BiFeO_3$ is expressed as $a^-a^-a^-$, under the classification by the Glazer method, while $BiCoO_3$ is expressed as $a^0a^0a^0$ under the classification by the Glazer method. The combinations of tilting directions of the octahedral structures in the two crystal structures are different. Accordingly, the two crystal structures have different periodicities of the repeating unit, in which polarization vectors have different lengths. Consequently, in the process of rotation of the polarization vector, the magnitude of the polarization vector must change, and therefore rotation of the polarization vector does not occur.

Regarding substances selected using the Glazer method according to the present invention, examples of the classification by the Glazer method include, in the case of rhombohedral crystals, $a^-a^-a^-$ for $BiFeO_3$, $(BiNa)TiO_3$, and the like; in the case of tetragonal crystals, $a^0a^0a^-$ for $SrTiO_3$ and $(CaSr)TiO_3$, $a^0a^0c^+$ for $(Na, Sr)NbO_3$, $a^0b^+b^+$, $a^0a^0c^+$, and the like; and in the case of orthorhombic crystals, $a^+a^-a^-$ for $CaTiO_3$, $a^+b^+c^-$, $a^+a^+c^-$, $a^+b^+b^-$, $a^+a^+a^-$, $a^+b^-b^-$, $a^0b^+c^+$, $a^0b^+c^-$, $a^0b^+b^-$, $a^0b^-b^-$, $a^+b^+c^+$, and $a^+b^+b^+$. Monoclinic crystals can be formed by solid solutions of rhombohedral crystals, tetragonal crystals, and orthorhombic crystals.

Furthermore, since these crystal structures are very similar to the cubic crystal structure, they may be referred to as "pseudo-cubic crystals". In order to accurately identify the crystal structures, Rietveld analysis of x-ray diffraction and analysis of temperature dependence of lattice constants and atomic positions using a TEM or the like can be employed.

Furthermore, regarding polarization vectors, a phenomenon in which upon application of an electric field, the crystal structure transforms from a tetragonal crystal through a monoclinic crystal to a rhombohedral crystal will be described below using the periodicity of the repeating unit of each crystal structure.

Figure 7:
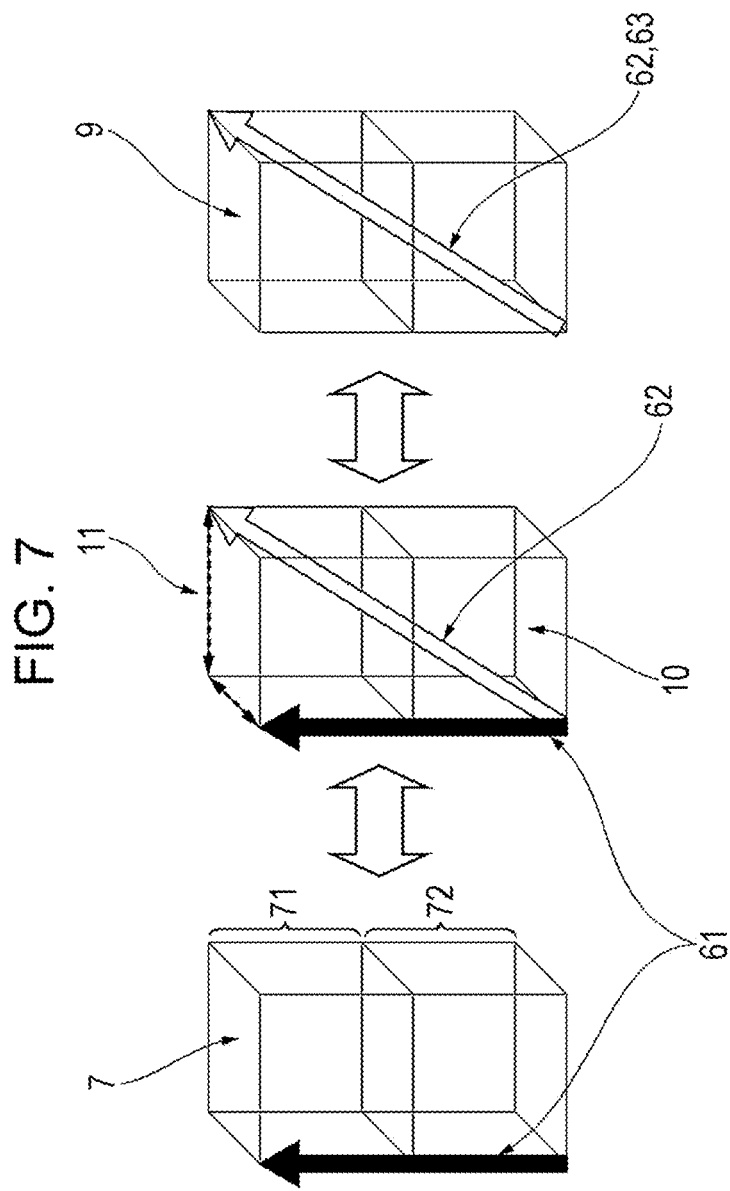
FIG. 7 is a schematic diagram showing polarization vectors of a tetragonal crystal having a periodicity and a rhombohedral crystal having a periodicity.

FIG. 7 schematically shows rotation of polarization vectors when an electric field is applied to a crystal structure having a periodicity with a repeating unit of two crystal structures, in each of which the periodicity of the repeating unit does not change during transformation of the crystal structure from a tetragonal crystal through a monoclinic crystal to a rhombohedral crystal. A tetragonal crystal 7 has a periodicity with a repeating unit of two crystal structures (refer to FIG. 7), and has a polarization vector 61 in the [001]

direction extending over the two tetragonal crystals 7. By applying an electric field thereto, the tetragonal crystal 7 is transformed into a monoclinic crystal 10 while maintaining the periodicity of the repeating unit of two crystal structures. At this time, since the periodicity of the repeating unit of the crystal structures is maintained, the polarization vector 61 extending over the two crystal structures can also become a polarization vector 62 in the [111] direction through a polarization vector rotation path 11 with a slight change in magnitude. By further applying an electric field thereto, the monoclinic crystal 10 is transformed into a rhombohedral crystal 9 while maintaining the periodicity of the repeating unit of two crystal structures. At this time, since the periodicity of the repeating unit of two crystal structures is maintained, the polarization vector 62 in the [111] direction becomes a polarization vector 63 in the [111] direction extending over the two crystal structures without a change in magnitude.

That is, when an electric field is applied, in order for the polarization vector 61 in the [001] direction to rotate to the polarization vector 63 in the [111] direction through the polarization vector rotation path 11, it is necessary that the periodicity of the repeating unit of the crystal structures should be maintained without being changed by the crystal structure transformation upon application of an electric field. The substance selected using the Glazer method according to the present invention has a repeating unit of two crystal structures, and the periodicity of the repeating unit of the crystal structures does not change when the crystal structure is transformed upon application of an electric field, and the periodicity can be maintained.

As described above, in the case of a solid solution of a ceramic composition characterized by having, as a main structure, a unit cell including at least two selected from the group consisting of a monoclinic crystal, a tetragonal crystal, an orthorhombic crystal, and a rhombohedral crystal, in which when the monoclinic crystal, the tetragonal crystal, the orthorhombic crystal, and the rhombohedral crystal are represented by the symmetry notation according to the Glazer method, namely $x^{n1}y^{n2}z^{n3}$, n1, n2, and n3 are at least one selected from the group consisting of + and −, or at least two selected from the group consisting of 0, +, and −, in the process of transformation of the crystal structure, the magnitude of the polarization vector does not change, and the polarization vector can rotate. Therefore, it is possible to obtain a ceramic composition having a high relative dielectric constant attributable to the rotation of the polarization vector.

EXAMPLES

The contents of the present invention will be described in further detail on the basis of examples and comparative examples. However, the present invention is not limited to the examples described below.

Examples 1-1 and 1-2, Comparative Examples 1-1 to 1-6

As two substances having the same periodicity of the repeating unit of the crystal structure and having different crystal structures selected from the group consisting of a monoclinic crystal, a tetragonal crystal, an orthorhombic crystal, and a rhombohedral crystal, $BiFeO_3$ having a rhombohedral crystal structure and expressed as $a^-a^-a^-$ by the Glazer method and $SrTiO_3$ having a cubic crystal structure at around room temperature but a tetragonal crystal structure in a low-temperature range at about −160° C. or lower and expressed as $a^0a^0a^-$ by the Glazer method were selected as ceramic starting materials.

In order to obtain a dielectric ceramic composition represented by general formula $(Bi_{1-x}Sr_x)(Fe_{1-x}Ti_x)O_3$, which is a solid solution of $BiFeO_3$ and $SrTiO_3$, as ceramic starting materials, $Bi_2O_3$ (average particle size: about 200 to 500 nm), $Fe_2O_3$ (average particle size: about 500 nm), $SrCO_3$ (average particle size: about 200 to 500 nm), and $TiO_2$ (average particle size: about 100 nm) were weighed such that x=0, 0.3, 0.4, 0.5, and 1 when represented by general formula $(Bi_{1-x}Sr_x)(Fe_{1-x}Ti_x)O_3$ and mixed in a ball mill. The mixed starting material slurry was dried at 130° C. and then mixed with a polyvinyl alcohol solution serving as a binder, and the resulting mixture was pressure-formed into a disc shape with a diameter of 12 mm and a thickness of 0.5 mm.

Pressure-formed samples were subjected to debinding treatment by heating to 260° C. in the air, and then the temperature was raised at 200° C./hour in the air. The disc-shaped samples were held at 1,000° C., 1,100° C., 1,200° C., or 1,400° C. for two hours and sintered to obtain measurement samples.

An In—Ga eutectic alloy was applied as electrodes to the resulting disc-shaped samples, and then the capacitance and the dielectric loss were measured using a digital LCR meter (HP4284A manufactured by Hewlett-Packard Company) under the conditions of a frequency of 1 kHz and an input voltage of 1 Vrms. The relative dielectric constant (no unit of measure) was calculated from the resulting capacitance, the thickness of the disc-shaped sample, and the electrode area.

In order to identify the unit cell in each of the resulting disc-shaped sample, the space group and the atomic coordinates were identified using an X-ray diffraction apparatus (SmartLab X-ray diffraction system manufactured by Rigaku Corporation) and electron diffraction by a TEM (transmission electron microscope JSF-2100F manufactured by JEOL Ltd). The perovskite-type crystal structures were classified by the Glazer method on the basis of the space group and the atomic coordinates, and the measurement results of the crystal structures are shown in Table 1.

Table 1 confirms that, in Example 1, the crystal structure was a perovskite-type crystal structure, and the unit cell was in a mixed crystal state of a monoclinic crystal ($a^-b^-b^-$) and a rhombohedral crystal ($a^-a^-a^-$). Furthermore, in Example 2, the crystal structure was a perovskite-type crystal structure, and the unit cell was in a mixed crystal state of a monoclinic crystal ($a^-b^-b^-$) and a tetragonal crystal ($a^0a^0a^-$). In Examples 1 and 2, it was possible to obtain a high relative dielectric constant of 500 or more.

On the other hand, in Comparative Example 1, the crystal structure was a rhombohedral crystal only, and in Comparative Example 2, the crystal structure was a cubic crystal only. In these comparative examples, the relative dielectric constant was low and insufficient. Furthermore, in Comparative Examples 3 and 4, the firing temperature was low, sintering was not possible (unsintered), and therefore, it was not possible to measure the relative dielectric constant. In Comparative Examples 5 and 6, the firing temperature was high, and the samples were partially melted. Furthermore, the insulation resistance was low, it was not possible to measure the relative dielectric constant, and the unit cell included a cubic crystal only.

TABLE 1

| No. | X | Firing temperature [° C.] | Relative dielectric constant | Unit cell | | Glazer classification | |
|---|---|---|---|---|---|---|---|
| Example 1-1 | 0.2 | 1100 | 520 | Monoclinic | Rhombohedral | a–b–b– | a–a–a– |
| Example 1-2 | 0.5 | 1100 | 830 | Monoclinic | Tetragonal | a–b–b– | a0a0a– |
| Comparative Example 1-1 | 0 | 1000 | 80 | Rhombohedral | | a–a–a– | |
| Comparative Example 1-2 | 1 | 1400 | 230 | Cubic | | a0a0a0 | |
| Comparative Example 1-3 | 0.4 | 1000 | — | Unsintered | | — | |
| Comparative Example 1-4 | 0.5 | 1000 | — | Unsintered | | — | |
| Comparative Example 1-5 | 0.4 | 1200 | — | Cubic (partially melted) | | a0a0a0 | |
| Comparative Example 1-6 | 0.5 | 1200 | — | Cubic (partially melted) | | a0a0a0 | |

As described above, in the case where the unit cell includes a monoclinic crystal and a tetragonal crystal or a monoclinic crystal and a rhombohedral crystal, and when the crystal structures are represented by the symmetry notation according to the Glazer method, namely $x^{n1}y^{n2}z^{n3}$, n1, n2, and n3 are at least one selected from the group consisting of + and −, or at least two selected from the group consisting of 0, +, and −, the relative dielectric constant can be improved.

Figure 8:
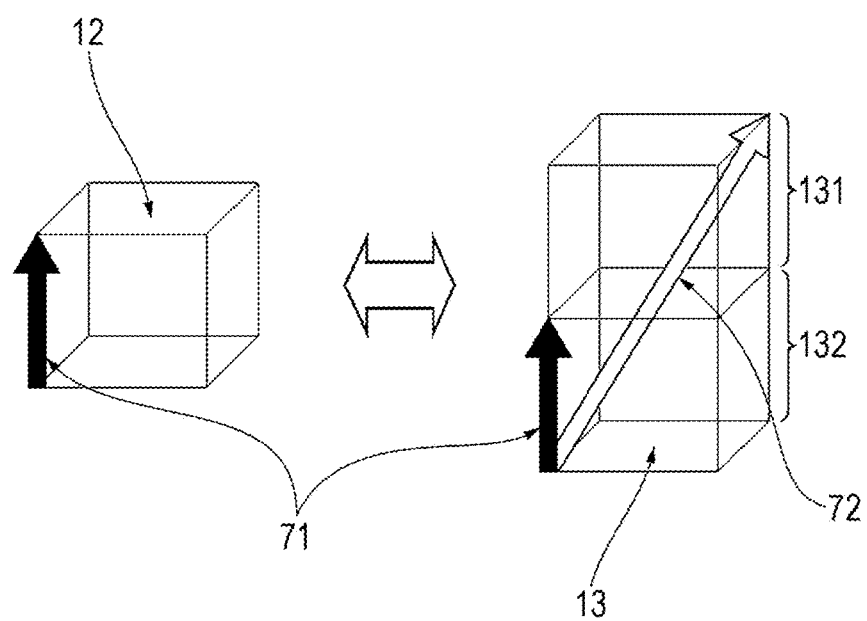
FIG. 8 is a schematic diagram showing polarization vectors of a tetragonal crystal having no periodicity and a rhombohedral crystal having a periodicity.

In contrast, in the case where such a combination is not selected, for example, when a combination of $BiFeO_3$ and $BiCoO_3$ is selected, rotation of a polarization rotation vector does not occur. In FIG. 8, when the crystal structure transforms from a tetragonal crystal through a monoclinic crystal to a rhombohedral crystal, the periodicity of a repeating unit varies among the crystal structures, and upon application of an electric field, the crystal structure transforms to a monoclinic crystal 13 having a periodicity of the polarization vector. At this time, since the periodicity of the repeating unit of the crystal structure changes, a polarization vector 71 of one crystal structure needs to become a polarization vector 72 in the [111] direction extending over two crystal structures. Since the repeating unit of the crystal structure changes, there is no rotation path from the polarization vector 71 to the polarization vector 72, and the polarization vector cannot rotate.

Figure 9:
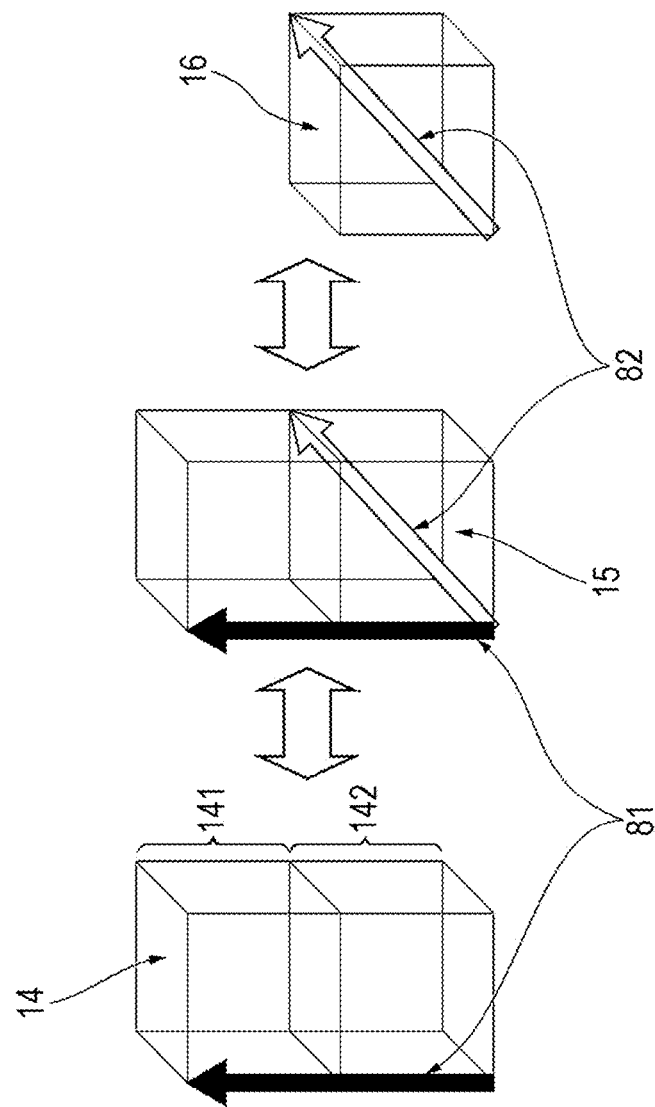
FIG. 9 is a schematic diagram showing polarization vectors of a tetragonal crystal having a periodicity and a rhombohedral crystal having no periodicity.

In FIG. 9, when the crystal structure transforms from a tetragonal crystal through a monoclinic crystal to a rhombohedral crystal, the periodicity of a repeating unit varies among the crystal structures, and rotation of a polarization vector upon application of an electric field is schematically shown. A tetragonal crystal 14 has a periodicity of a repeating unit of two crystal structures, and has a polarization vector 81 in the [001] direction extending over the two tetragonal crystals 14. By applying an electric field thereto, the tetragonal crystal 14 transforms to a monoclinic crystal 15 while maintaining the periodicity of a repeating unit of two crystal structures. However, the monoclinic crystal 15 further transforms to a rhombohedral crystal 16 having only a periodicity of a repeating unit of one crystal structure. Accordingly, regarding the rotation of the polarization vector, the polarization vector 81 in the [001] direction extending over the two crystal structures needs to become a polarization vector 82 in the [111] direction of one split crystal structure. However, since the periodicity of the crystal structure changes, the rotation path from the polarization vector 81 to the polarization vector 82 does not continue, and it is not possible to form a path. Therefore, the polarization vector cannot rotate upon application of an electric field.

Examples 2-1 to 2-3, Comparative Examples 2-1 and 2-2

In Example 2, $(Bi_{0.5}Na_{0.5})TiO_3$ having a rhombohedral crystal structure and expressed as $a^-a^-a^-$ by the Glazer method and $SrTiO_3$ having a cubic crystal structure at around room temperature but a tetragonal crystal structure in a low-temperature range at about −160° C. or lower and expressed as $a^0a^0a^-$ by the Glazer method were selected as ceramic starting materials. A dielectric ceramic composition represented by general formula $((Bi_{0.5}Na_{0.5})_xSr_{(1-x)})TiO_3$, which is a solid solution of $(Bi_{0.5}Na_{0.5})TiO_3$ and $SrTiO_3$, was produced.

The preparation of samples, evaluation of electrical properties, and identification of crystal structures were performed by the same methods as those in Example 1.

TABLE 2

| No. | x | Firing temperature [° C.] | Relative dielectric constant | Unit cell | | Glazer classification | |
|---|---|---|---|---|---|---|---|
| Example 2-1 | 0.3 | 1100 | 2500 | Monoclinic | Tetragonal | a–b–b– | a0a0a– |
| Example 2-2 | 0.5 | 1150 | 4000 | Monoclinic | Rhombohedral | a–b–b– | a–a–a– |
| Example 2-3 | 0.7 | 1200 | 2000 | Monoclinic | Rhombohedral | a–b–b– | a–a–a– |
| Comparative Example 2-1 | 0 | 1350 | 230 | Cubic | | a0a0a0 | |
| Comparative Example 2-2 | 1 | 1000 | 200 | Rhombohedral | | a–a–a– | |

Table 2 confirms that, in Example 2-1, the crystal structure was a perovskite-type crystal structure, and the unit cell was in a mixed crystal state of a monoclinic crystal ($a^-b^-b^-$) and a tetragonal crystal ($a^0a^0a^-$). Furthermore, in Examples 2-2 and 2-3, the crystal structure was a perovskite-type crystal structure, and the unit cell was in a mixed crystal state of a monoclinic crystal ($a^-b^-b^-$) and a rhombohedral crystal ($a^-a^-a^-$). In Examples 2-1 to 2-3, it was possible to obtain a high relative dielectric constant of 2,000 or more.

On the other hand, in Comparative Example 2-1, the crystal structure was a cubic crystal only, and in Comparative Example 2-2, the crystal structure was a rhombohedral crystal only. In these comparative examples, the relative dielectric constant was low and insufficient.

Examples 3-1 and 3-2, Comparative Examples 3-1 and 3-2

In Example 3, $(Bi_{0.5}Na_{0.5})TiO_3$ having a rhombohedral crystal structure and expressed as $a^-a^-a^-$ by the Glazer method and $(Ca_{0.35}Sr_{0.65})TiO_3$ having a tetragonal crystal structure and expressed as $a^0a^0a^-$ by the Glazer method were selected as ceramic starting materials. A dielectric ceramic composition represented by general formula $(Bi_{0.5}Na_{0.5})_x(Ca_{0.35}Sr_{0.65})_{(1-x)}TiO3$, which is a solid solution of $(Bi_{0.5}Na_{0.5})TiO_3$ and $(Ca_{0.35}Sr_{0.65})TiO_3$, was produced.

The preparation of samples, evaluation of electrical properties, and identification of crystal structures were performed by the same methods as those in Example 1.

TABLE 3

| No. | x | Firing temperature [° C.] | Relative dielectric constant | Unit cell | | Glazer classification | |
|---|---|---|---|---|---|---|---|
| Example 3-1 | 0.5 | 1150 | 900 | Monoclinic | Tetragonal | a–b–b– | a0a0a– |
| Example 3-2 | 0.7 | 1200 | 1000 | Monoclinic | Rhombohedral | a–b–b– | a–a–a– |
| Comparative Example 3-1 | 0 | 1200 | 200 | Tetragonal | | a0a0a– | |
| Comparative Example 3-2 | 1 | 1000 | 200 | Rhombohedral | | a–a–a– | |

Table 3 confirms that, in Example 3-1, the crystal structure was a perovskite-type crystal structure, and the unit cell was in a mixed crystal state of a monoclinic crystal ($a^-b^-b^-$) and a tetragonal crystal ($a^0a^0a^-$). Furthermore, in Example 3-2, the crystal structure was a perovskite-type crystal structure, and the unit cell was in a mixed crystal state of a monoclinic crystal ($a^-b^-b^-$) and a rhombohedral crystal ($a^-a^-a^-$). In Examples 3-1 and 3-2, it was possible to obtain a high relative dielectric constant of 900 or more.

On the other hand, in Comparative Example 3-1, the crystal structure was a tetragonal crystal only, and in Comparative Example 3-2, the crystal structure was a rhombohedral crystal only. In these comparative examples, the relative dielectric constant was low and insufficient.

Examples 4-1 and 4-2, Comparative Example 4-1 and 4-2

In Example 4, $(Bi_{0.5}Na_{0.5})TiO_3$ having a rhombohedral crystal structure and expressed as $a^-a^-a^-$ by the Glazer method and $CaTiO_3$ having an orthorhombic crystal structure and expressed as $a^+a^-a^-$ by the Glazer method were selected as ceramic starting materials. A dielectric ceramic composition represented by general formula $(Ca_x(Bi_{0.5}Na_{0.5})_{(1-x)})TiO_3$, which is a solid solution of $(Bi_{0.5}Na_{0.5})TiO_3$ and $CaTiO_3$, was produced.

The preparation of samples, evaluation of electrical properties, and identification of crystal structures were performed by the same methods as those in Example 1.

TABLE 4

| No. | x | Firing temperature [° C.] | Relative dielectric constant | Unit cell | | Glazer classification | |
|---|---|---|---|---|---|---|---|
| Example 4-1 | 0.2 | 1200 | 900 | Monoclinic | Rhombohedral | a–b–b– | a–a–a– |
| Example 4-2 | 0.4 | 1200 | 500 | Monoclinic | Orthorhombic | a–b–b– | a+a–a– |
| Comparative Example 4-1 | 0 | 1200 | 200 | Rhombohedral | | a–a–a– | |
| Comparative Example 4-2 | 1 | 1000 | 180 | Orthorhombic | | a+a–a– | |

Table 4 confirms that, in Example 4-1, the crystal structure was a perovskite-type crystal structure, and the unit cell was in a mixed crystal state of a monoclinic crystal ($a^-b^-b^-$) and a rhombohedral crystal ($a^-a^-a^-$). Furthermore, in Example 4-2, the crystal structure was a perovskite-type crystal structure, and the unit cell was in a mixed crystal state of a monoclinic crystal ($a^-b^-b^-$) and an orthorhombic crystal ($a^+a^-a^-$). In Examples 4-1 and 4-2, it was possible to obtain a high relative dielectric constant of 500 or more.

On the other hand, in Comparative Example 4-1, the crystal structure was a rhombohedral crystal only, and in Comparative Example 4-2, the crystal structure was an orthorhombic crystal only. In these comparative examples, the relative dielectric constant was low and insufficient.

As described above, when the unit cell had crystal structures including a monoclinic crystal and an orthorhombic crystal, or a monoclinic crystal and a rhombohedral crystal, in which when the crystal structures are represented by the symmetry notation according to the Glazer method, namely $x^{n1}y^{n2}z^{n3}$, n1, n2, and n3 are at least one selected from the group consisting of + and –, or at least two selected from the group consisting of 0, +, and –, it was possible to improve the relative dielectric constant.

INDUSTRIAL APPLICABILITY

As described above, ceramic compositions according to the present invention have industrial applicability as dielectric devices and piezoelectric devices.

REFERENCE SIGNS LIST

1 Sr atom
2 Zr atom
3 oxygen atom
4 octahedral structure
5 Ba atom
61, 62, 63, 71, 72, 73, 81, and 82 polarization vector
7, 12, 14 unit structure of tetragonal crystal
9, 16 unit structure of rhombohedral crystal
10, 13, 15 unit structure of monoclinic crystal
11 polarization vector rotation path

The invention claimed is:

1. A ceramic composition which is a perovskite-type ceramic composition comprising a unit cell having at least two crystal structures selected from the group consisting of a monoclinic crystal, a tetragonal crystal, an orthorhombic crystal, and a rhombohedral crystal, wherein when the crystal structures are represented by the symmetry notation according to the Glazer method, namely $x^{n1}y^{n2}z^{n3}$, n1, n2, and n3 are at least one selected from the group consisting of + and −, or at least two selected from the group consisting of 0, +, and −,
wherein the perovskite-type ceramic composition is not derived from a solid solution consisting of $BiFeO_3$ and $SrTiO_3$.

2. The ceramic composition according to claim 1, wherein when the tetragonal crystal is represented by the symmetry notation according to the Glazer method, x=y and the tetragonal crystal is expressed as $x^0y^0z^-$.

3. The ceramic composition according to claim 1, wherein when the rhombohedral crystal is represented by the symmetry notation according to the Glazer method, x=y=z and the rhombohedral crystal is expressed as $x^-y^-z^-$.

4. The ceramic composition according to claim 1, wherein at least two are selected from the monoclinic crystal, the tetragonal crystal, and the rhombohedral crystal.

5. The ceramic composition according to claim 1, wherein the ceramic composition is represented by general formula $ABR_3$ where A is at least one selected from the group consisting of Ba, Bi, Ca, Na, Sr, and K, B is at least one selected from the group consisting of Nb, Ta, Ti, Zr, Fe, Hf, Sn, Co, and Mn, and R is O or N.

6. The ceramic composition according to claim 2, wherein when the rhombohedral crystal is represented by the symmetry notation according to the Glazer method, x=y=z and the rhombohedral crystal is expressed as $x^-y^-z^-$.

7. The ceramic composition according to claim 2, wherein at least two are selected from the monoclinic crystal, the tetragonal crystal, and the rhombohedral crystal.

8. The ceramic composition according to claim 3, wherein at least two are selected from the monoclinic crystal, the tetragonal crystal, and the rhombohedral crystal.

9. The ceramic composition according to claim 6, wherein at least two are selected from the monoclinic crystal, the tetragonal crystal, and the rhombohedral crystal.

10. The ceramic composition according to claim 2, wherein the ceramic composition is represented by general formula $ABR_3$ where A is at least one selected from the group consisting of Ba, Bi, Ca, Na, Sr, and K, B is at least one selected from the group consisting of Nb, Ta, Ti, Zr, Fe, Hf, Sn, Co, and Mn, and R is O or N.

11. The ceramic composition according to claim 3, wherein the ceramic composition is represented by general formula $ABR_3$ where A is at least one selected from the group consisting of Ba, Bi, Ca, Na, Sr, and K, B is at least one selected from the group consisting of Nb, Ta, Ti, Zr, Fe, Hf, Sn, Co, and Mn, and R is O or N.

12. The ceramic composition according to claim 6, wherein the ceramic composition is represented by general formula $ABR_3$ where A is at least one selected from the group consisting of Ba, Bi, Ca, Na, Sr, and K, B is at least one selected from the group consisting of Nb, Ta, Ti, Zr, Fe, Hf, Sn, Co, and Mn, and R is O or N.

13. The ceramic composition according to claim 4, wherein the ceramic composition is represented by general formula $ABR_3$ where A is at least one selected from the group consisting of Ba, Bi, Ca, Na, Sr, and K, B is at least one selected from the group consisting of Nb, Ta, Ti, Zr, Fe, Hf, Sn, Co, and Mn, and R is O or N.

14. The ceramic composition according to claim 7, wherein the ceramic composition is represented by general formula $ABR_3$ where A is at least one selected from the group consisting of Ba, Bi, Ca, Na, Sr, and K, B is at least one selected from the group consisting of Nb, Ta, Ti, Zr, Fe, Hf, Sn, Co, and Mn, and R is O or N.

15. The ceramic composition according to claim 8, wherein the ceramic composition is represented by general formula $ABR_3$ where A is at least one selected from the group consisting of Ba, Bi, Ca, Na, Sr, and K, B is at least one selected from the group consisting of Nb, Ta, Ti, Zr, Fe, Hf, Sn, Co, and Mn, and R is O or N.

16. The ceramic composition according to claim 9, wherein the ceramic composition is represented by general formula $ABR_3$ where A is at least one selected from the group consisting of Ba, Bi, Ca, Na, Sr, and K, B is at least one selected from the group consisting of Nb, Ta, Ti, Zr, Fe, Hf, Sn, Co, and Mn, and R is O or N.

17. The ceramic composition according to claim 1, wherein the perovskite-type ceramic composition is derived from a solid solution of $(Bi_{0.5}Na_{0.5})TiO_3$ and $SrTiO_3$.

18. The ceramic composition according to claim 1, wherein the perovskite-type ceramic composition is derived from a solid solution of $(Bi_{0.5}Na_{0.5})TiO_3$ and $(Ca_{0.35}Sr_{0.65})TiO_3$.

19. The ceramic composition according to claim 1, wherein the perovskite-type ceramic composition is derived from a solid solution of $(Bi_{0.5}Na_{0.5})TiO_3$ and $CaTiO_3$.

* * * * *